United States Patent [19]

Steigerwald

[11] 3,940,633
[45] Feb. 24, 1976

[54] GTO TURN-OFF CIRCUIT PROVIDING TURN-OFF GATE CURRENT PULSE PROPORTIONAL TO ANODE CURRENT

[75] Inventor: Robert L. Steigerwald, Scotia, N.Y.

[73] Assignee: General Electric Company, Schenectady, N.Y.

[22] Filed: July 1, 1974

[21] Appl. No.: 484,613

[52] U.S. Cl............ 307/252 C; 307/240; 307/252 J; 307/305
[51] Int. Cl.² ....................................... H03K 17/72
[58] Field of Search............ 307/240, 252 C, 252 H, 307/252 J, 305

[56] References Cited
UNITED STATES PATENTS

| | | | |
|---|---|---|---|
| 3,308,800 | 3/1967 | Motto, Jr. et al. | 307/252 C |
| 3,353,032 | 11/1967 | Morgan et al. | 307/252 C |
| 3,609,476 | 9/1971 | Storm | 357/38 |
| 3,622,806 | 11/1971 | Williams | 307/252 C X |
| 3,840,275 | 10/1974 | Takahashi | 307/252 C |
| 3,855,518 | 12/1974 | Genuit | 307/252 C X |

*Primary Examiner*—Stanley D. Miller, Jr.
*Assistant Examiner*—L. N. Anagnos
*Attorney, Agent, or Firm*—Donald R. Campbell; Joseph T. Cohen; Jerome C. Squillaro

[57] ABSTRACT

A turn-off circuit for a gate turn-off thyristor (GTO) generates a ramped turn-off gate current pulse which, because of the increase in device storage time with anode current, has a peak magnitude approximately proportional to the anode current. The direct-coupled or transformer-coupled turn-off circuit employs a transformer controlled by a solid state switch with the secondary winding connected to return excess energy to a supply.

5 Claims, 8 Drawing Figures

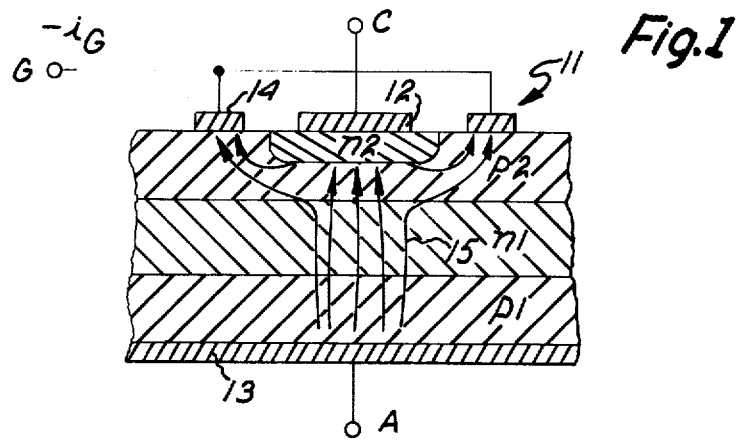
Fig. 1
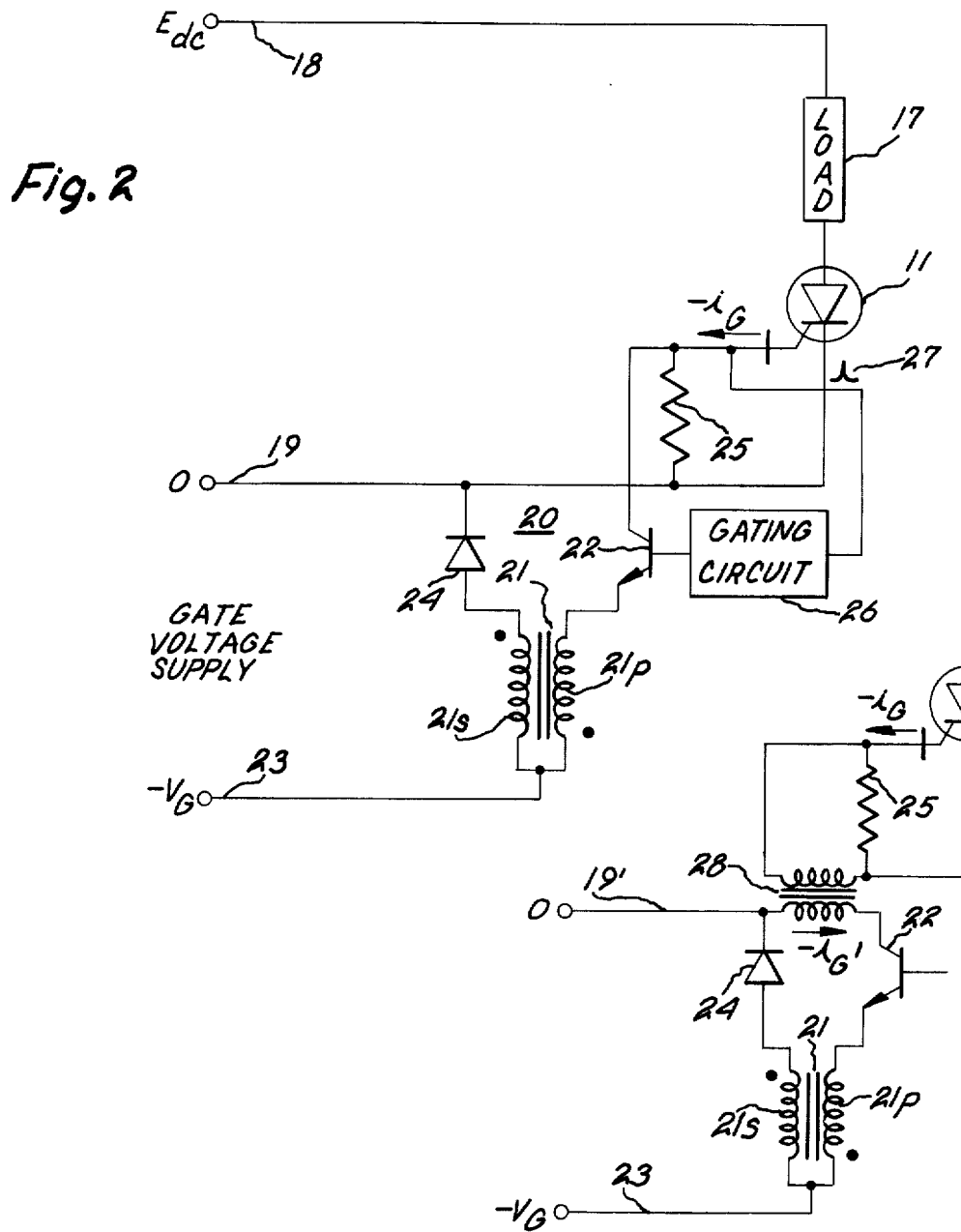
Fig. 2
Fig. 5

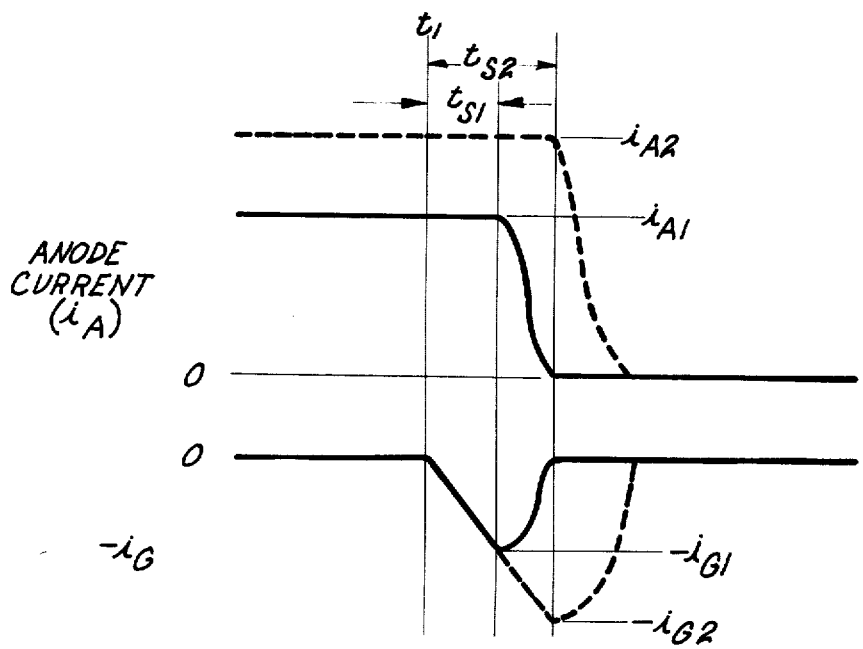
Fig. 3a
Fig. 3b
Fig. 3c
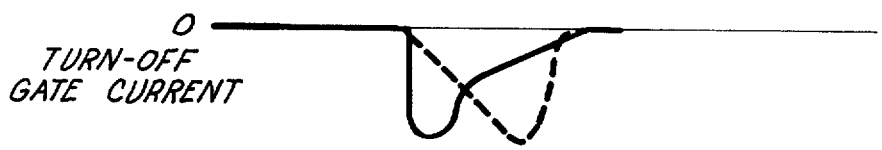
Fig. 4a
Fig. 4b

GTO TURN-OFF CIRCUIT PROVIDING TURN-OFF GATE CURRENT PULSE PROPORTIONAL TO ANODE CURRENT

BACKGROUND OF THE INVENTION

THis invention relates to turn-off circuits for a gate turn-off thyristor (GTO), and more particularly to circuits for providing a turn-off gate current pulse having a magnitude approximately proportional to the anode current.

The gate turn-off thyristor is a reverse blocking triode thyristor similar to the ordinary SCR in that the device is triggered into conduction by the application of a gating pulse which injects current into the gate lead, but dissimilar in that the anode current is turned off by a reverse gate pulse which withdraws current from the gate lead. DUe to the regenerative nature of the GTO device, which is also known as the gate turn-off switch or gate controlled switch, a relatively high reverse gate current is required to turn off the anode current. Typically a reverse gate current with a magnitude equal to at least 10 percent to 50 percent of the anode current is needed to obtain reliable turn-off. In practice, it is common to supply a preselected reverse gate pulse of sufficiently high magnitude to turn off the largest GTO anode current expected. In many cases the largest expected current is an overload current or even a fault current. Hence, in some circuits an unusually high turn-off gate current may be present even under full load conditions while at light loads the turn-off current may be several times larger than the anode current, thereby resulting in extremely inefficient operation.

An improved and more efficient circuit operation is achieved by a turn-off circuit which generates a variable magnitude reverse gate current more suitably matched to the magnitude of the anode current or load current to be turned off. While it is possible to sense the anode current directly, active approaches requiring knowledge of the anode current itself tend to be complicated and not suited for general use.

SUMMARY OF THE INVENTION

In accordance with the invention, a turn-off circuit is effectively coupled between the gate and cathode of a gate turn-off thyristor for selectively generating a ramped turn-off gate current pulse which increases for an interval substantially equal to the storage time, and thereafter decreases with a peak magnitude which varies with or is approximately proportional to the magnitude of the GTO anode current. Since the storage time increases and decreases with the anode current, a variable magnitude turn-off gate current is produced for efficient circuit operation with both heavy and light loads. THe ramped turn-off gate current is desirable to eliminate anode current "tailing" effects which could cause high power dissipation and device failure. To obtain this improved turn-off gate current wave shape, the turn-off circuit is comprised by a transformer having a primary winding connected in series with a controlled solid state switch and energized by a constant unidirectional gate voltage, the transformer secondary winding being connected in series with a diode for returning excess energy to the gate supply or another supply. In the preferred embodiment, a direct-coupled turn-off circuit using a transistor switch is described, however, a transformer-coupled modification is given.

Useful in a variety of power circuits such as choppers and inverters, the turn-off circuit operates essentially on an instantaneous basis utilizing the inherent device switching mechanism without requiring actual sensing of the anode current.

BRIEF DESCRIPTION OF THE DRAWINGS

FIG. 1 is a fragmentary schematic cross section through an interdigitated gate turn-off thyristor;

FIG. 2 is a schematic circuit diagram of a GTO chopper circuit constructed with a turn-off circuit for generating turnoff gate current pulses proportional to the anode current with provision for returning energy to the supply;

FIGS. 3a–3c are waveform diagrams, respectively, of the anode current, $i_A$; the turn-off gate current, $-i_G$; and the energy return diode current, $-i_D$, for two values of the anode current as shown by full and dashed lines;

FIGS. 4a and 4b are waveform diagrams, respectively, of the anode current and turn-off gate current illustrating the improved waveform with less anode current "tailing" achieved by the use of a ramped turn-off gate current (dashed lines) as compared to an abrupt turn-off gate current (full lines); and FIG. 5 is a modification of FIG. 2, part of the power circuit being omitted, illustrating a transformer-coupled turnoff circuit.

DESCRIPTION OF THE PREFERRED EMBODIMENT

The power gate turn-off thyristor 11 shown in FIG. 1 is a four-layer silicon pnpn switch with an interdigitated structure of the type described, for instance, in U.S. Pat. No. 3,609,476 to H. F. Storm, granted Sept. 28, 1971, and assigned to the same assignee. Within its broader scope, the invention applies also to lower power GTO devices without interdigitation. In the device illustrated, the outer semiconductor layers on which the cathode contact stripes 12 and the anode contact 13 are respectively deposited are known as the $n2$-emitter layer and the $p1$-emitter layer, while the inner semiconductor layers are known as the p2-base layer and the n1-base layer. The gate contact stripes 14 are deposited on the $p2$-base layer at either side of the emitter stripes and are interdigitated with the cathode contact stripes 12. It is desirable to review briefly the distinctive features of the turn-off mechanism in a GTO device whereby the anode current flowing from the anode terminal A to the cathode terminal C is turned off when a reverse gate pulse is applied to the gate terminal G. The main effect to be observed is the squeezing of the current density lines 15 under the $n2$-emitter due to the lateral voltage drop in the $p2$-base which is caused by the reverse gate current $-i_G$ being withdrawn from the gate terminal. The regions immediately adjacent to the gate contacts 14 are the first to become non-conducting, and as current is squeezed toward the center of the emitter, turn-off begins at the edge of the emitter and proceeds inwardly as the current density increases at and near the center of the emitter. During this time interval, which may constitute a major portion of the GTO storage time $t_s$, the anode current is still constant since the center portion of the emitter is still conducting. THe storage time is defined (see FIG. 3a) as the interval between the application of the reverse gate current pulse and the time when the anode current begins to fall or turn off. When the conducting region is squeezed to a small enough dimension, the device turns off in a one-dimensional manner as the regenerative processes are interrupted. The storage time $t_S$ relates to the time required to squeeze the conducting region to a size small enough so that the carriers associated with the p2-base can be reduced by the gate current to values such that the blocking junction (the p2-n1 junction) comes out of saturation or forward bias. Thereafter the device turns off. The storage time increases as the magnitude of the anode current increases.

The turn-off circuit for providing a ramped turn-off gate current pulse with a peak magnitude which increases and decreases as the anode current increases and decreases is illustrated in FIG. 2 with regard to a GTO chopper circuit. It is useful, however, in a variety of power circuits and other circuitry such as an inverter of the type illustrated in the inventor's allowed copending application, Ser. No. 481,147 filed on June 20, 1974 and entitled "Turn-off Circuit for Gate Turn-off Thyristors and Transistors Using Snubber Energy". In the d-c to d-c chopper circuit, GTO 11 is connected in series with a load 17 across a pair of input voltage supply lines 18 and 19 between which is applied the energizing voltage $E_{dc}$. The device symbol used for the GTO is an encircled conventional thyristor symbol with a vertical bar at the gate lead to indicate gate turn-off capability. The turn-off circuit indicated generally at 20 is comprised by a transformer 21 having a primary winding 21p connected in series with an npn transistor switch 22 between the gate of GTO 11 and a gate voltage supply line 23 to which is applied the gate voltage $-V_G$. The magnetically coupled secondary winding 21s of the transformer is connected in series with a diode 24 between the gate voltage supply lines 23 and 19 to return excess energy to the gate supply. A resistor 25 or other impedance is connected between the gate and cathode of GTO 11 to provide a path for the circulation of excess energy after recovery of the cathode-gate junction. A suitable gating circuit 26 supplies periodically timed turn-on gate pulses 27 to GTO 11 and also provides timed base drive signals to transistor switch 22 to initiate generation of the reverse gate current pulses. If desired, another controlled solid state switch such as an SCR or another GTO can be used in place of the transistor switch 22. Instead of returning excess energy to the gate supply, the series circuit comprised by secondary winding 21s and diode 24 can be connected to return energy to any selected supply.

The operation of the turn-off circuit 20 is explained with reference to the pertinent current waveforms in FIGS. 3a–3c, which are not necessarily to scale since the reverse gate current $-i_G$ is typically 10 percent to 50 percent of the anode current $i_A$, and the energy return diode current $-i_D$ is at the same scale as $-i_G$. The turn-off circuit utilizes the fact that the GTO storage time increases as the GTO anode current increases. Assuming that GTO 11 is conducting an anode current of magnitude $i_{A1}$ as shown in FIG. 3a, transistor switch 22 is rendered conductive at the time $t_1$ to initiate generation of the turn-off gate current pulse. Since the device has been in the conducting state, the gate of the GTO device is in a low impedance state, and the voltage drop from the cathode to gate is small when the reverse gate current $-i_G$ begins to flow. The reverse gate current (FIG. 3b) increases essentially as a linear ramp since the substantially constant gate voltage $-V_G$ (less semiconductor drops) is applied across the inductance provided by the transformer winding 21p, the semiconductor drops being considered constant. During the time when the current in primary winding 21p is increasing, diode 24 is reverse biased due to the polarity of the coupling of the windings 21s and 21p. Accordingly, the reverse gate current continues to increase substantially linearly for a time equal to the GTO's storage time $t_{S1}$. At the end of the storage time, the anode current begins to decrease as the device starts to turn off and the cathode-gate junction begins to revert to the high impedance state. Hence, the current flowing in transformer primary winding 21p begins to decrease and the voltage on the primary winding reverses polarity. The peak magnitude of the reverse gate current $-i_{G1}$, it is observed, depends on the storage time interval which in turn varies with the anode current. When the voltage drop across the cathode-gate junction of GTo 11 becomes high enough, the voltage across secondary winding 21s increases and forward biases the diode 24 so that it conducts current. Thus, the peak reverse voltage across the cathode-gate junction is clamped due to the transformer action of windings 21p and 21s, which typically have the same number of turns. Of course, the turns ratio is selected to satisfy the requirements of the particular application at hand. When the cathode-gate junction is completely recovered, the energy stored in winding 21p is transferred to winding 21s and is discharged back to the gate supply. The diode current decreases essentially as a linear ramp from a value $-i_{D1}$ as shown in FIG. 3c since the substantially constant voltage $-V_G$ is applied across the winding 21s. The transistor switch 22 can be rendered non-conductive at some convenient point after the reverse gate current has fully turned off the device, or it can be held in the conducting state to apply a constant negative gate voltage to the GTO during the GTO off-time. This choice is influenced by the particular GTO being used and by the magnitude of the gate supply voltage.

Thus, the operation of the turn-off circuit 20 is to selectively generate a ramped turn-off gate current pulse which increases for an interval substantially equal to the GTO storage time and thereafter decreases, with a peak magnitude which varies with or is approximately proportional to the anode current. As the anode current increases or decreases, the storage time $t_S$ changes in corresponding fashion to thereby provide more or less time for the reverse gate current flowing in primary winding 21p to increase linearly. This is clarified by reference to the dashed line current waveforms in FIGS. 3a–3c for the case in which the magnitude of the anode current $i_{A2}$ is raised to a higher level, the storage time is also increased (to $t_{S2}$ in this case). Accordingly, the reverse gate current has a longer time to build up in winding 21p and the peak magnitude $-i_{G2}$ is larger than the previous case. The peak magnitude $-i_{D2}$ of the diode current representing excess energy returned to the gate supply is also larger. In effect, the peak magnitude of the turn-off gate current pulse is variable and depends on the magnitude of the anode current. The characteristics of practical gate turn-off thyristors are such that the peak turn-off gate current increases and decreases as the anode current increases and decreases using the type of turn-off pulse described here.

Instead of being direct-coupled to the cathode and gate of GTO 11, the turn-off circuit 20 can be transformer-coupled as illustrated in FIG. 5. One winding of the coupling transformer 28 is connected between the gate and cathode of the GTo device, while the other winding is connected in series with the transistor switch 22 and pulse transformer primary winding 21p between the gate voltage supply lines 19' and 23. This arrangement provides isolation for the turn-off circuit 20 with the option of selecting the turns ratio so that the reverse gate current $-i_G$ in the turn-off circuit is different from the gate current $-i_G$.

It is evident that efficient circuit operation is obtained by providing a variable turn-off gate current pulse which changes with the anode current. This manner of operation eliminates unnecessarily high reverse gate currents when the GTO anode current is low, and the main circuit operates at high efficiency under light loads as well as heavy loads. For all practical purposes, the new GTO turn-off circuit here described is operative essentially on an instantaneous basis for either varying or steady anode currents. A particular advantage is that it is not necessary to use anode current sensing devices or circuitry since the generation of a turn-off gate current pulse with a peak which varies with or is approximately proportional to the anode current results from the inherent circuit operation. The turn-off circuit is therefore low cost, and it is further noted that the only losses are the GTO gate losses and parasitic circuit losses. There are no resistors in the turn-off circuit and excess energy is returned to the gate voltage supply or any other desired supply.

In addition, the ramped turn-off gate current pulse generated by the turn-off circuit constructed in accordance with this invention has an improved waveform which eliminates or materially reduces the anode current tailing phenomenon observed in many devices. An anode current tail is illustrated by the full line anode current waveform in FIG. 4a, in which the anode current at turn-off initially falls rapidly and then decreases at a much slower rate resulting in a relatively long anode current fall time $t_{F1}$. This tailing is related to stored charge in the n1-base layer (FIG. 1) which does not have a gate lead to remove excess charges. If an abrupt or initially fast falling reverse gate pulse of the type shown in full lines in FIG. 4B is applied, the device storage time is too short to allow charge in the n1-base layer to recombine or diffuse or drift to a reverse biased junction. Therefore, when the cathodegate junction becomes reverse biased, a tail of current results due to the charge stored in the n1-base. Since the voltage across the GTO device is increasing at this time, the presence of anode current tailing results in high dissipation which may result in device failure. The ramped turn-off gate current pulse illustrated in dashed lines, however, increases the GTO storage time and allows a sufficient interval for the charge in the n1-base to redistribute and recombine before the cathode-gate junction becomes reverse biased. In this manner the anode current tailing effect and its associated high dissipation region are reduced.

In summary, a low cost direct-coupled or transformer-coupled GTO turn-off circuit generates a ramped turn-off gate current pulse with an improved waveform and a variable peak magnitude dependent upon the anode current magnitude. Efficient circuit operation is enhanced by returning excess energy to a gate voltage supply or other supply. The same techniques can be used with an anode-gated GTO device, and in this case the turn-off gate current is applied between the anode and gate and has a magnitude which varies with the cathode current.

While the invention has been particularly shown and described with reference to a preferred embodiment thereof, it will be understood by those skilled in the art that various changes in form and detail may be made therein without departing from the spirit and scope of the invention.

The invention claimed is:

1. A solid state circuit including a semiconductor device with a gate turn-off circuit comprising
   a gate turn-off thyristor semiconductor device having an anode and a cathode and a gate terminal for controlling switching of said device between a conducting state in which anode current flows and a nonconducting state, said gate turn-off thyristor being coupled to a pair of unidirectional input voltage supply lines between which is applied an energizing voltage, and
   turn-off circuit means for selectively generating a ramped turn-off gate current pulse with a peak magnitude which increases and decreases as said anode current increases and decreases,
   said turn-off circuit means being comprised by a transformer having a primary winding connected in series with a controlled solid state switch device between said gate terminal and a negative unidirectional gate voltage supply line, and means for rendering conductive said controlled solid state switch for a selected interval to initiate generation of said gate turn-off current pulse, said transformer having a secondary winding connected in series with a diode and comprising means for returning excess energy stored in said primary winding to a selected voltage supply.

2. A solid state circuit according to claim 1 wherein the selected voltage supply to which the excess energy is returned is the gate voltage supply, and said transformer secondary winding and series-connected diode are connected between said negative gate voltage supply line and one input voltage supply line coupled to the cathode of said device.

3. A solid state circuit according to claim 2 further including means for supplying turn-on pulses to the gate terminal of said device.

4. A solid state circuit including a semiconductor device with a turn-off circuit comprising
   a gate turn-off thyristor semiconductor device having an anode and a cathode and a gate terminal for controlling switching of said device between a conducting state in which anode current flows and a nonconducting state, said gate turn-off thyristor being coupled between a pair of input voltage supply lines between which is applied an energizing voltage, and
   turn-off circuit means for selectively generating a ramped turn-off gate current pulse with a peak magnitude which increases and decreases as said anode current increases and decreases,
   said turn-off circuit means being energized by a pair of constant unidirectional gate voltage supply lines and including a first transformer having a primary winding connected in series with a controlled solid state switch and the primary winding of a second transformer between said gate voltage supply lines, and means for rendering conductive said controlled solid state switch for a preselected interval to initiate generation of said turn-off current pulse, said second transformer having a secondary winding connected between said gate terminal and cathode to couple said turn-off current pulse to said gate terminal, said first transformer having a secondary winding connected in series with a diode and comprising means for returning excess energy stored in said first transformer primary winding to a selected voltage supply.

5. A solid state circuit according to claim 4 wherein the selected voltage supply to which excess energy is returned is the gate voltage supply, and said first transformer secondary winding and series-connected diode are connected between said gate voltage supply lines.

* * * * *